(12) United States Patent
Bauer et al.

(10) Patent No.: US 7,876,179 B2
(45) Date of Patent: Jan. 25, 2011

(54) SAW FILTER COMPRISING A BROADBAND BAND-STOP FILTER

(75) Inventors: Thomas Bauer, Munich (DE); Matthias Jungkunz, Munich (DE)

(73) Assignee: Epcos AG, Munich (DE)

( * ) Notice: Subject to any disclaimer, the term of this patent is extended or adjusted under 35 U.S.C. 154(b) by 259 days.

(21) Appl. No.: 12/091,077

(22) PCT Filed: Oct. 12, 2006

(86) PCT No.: PCT/DE2006/001798

§ 371 (c)(1),
(2), (4) Date: May 16, 2008

(87) PCT Pub. No.: WO2007/048376

PCT Pub. Date: May 3, 2007

(65) Prior Publication Data

US 2008/0258983 A1    Oct. 23, 2008

(30) Foreign Application Priority Data

Oct. 28, 2005    (DE) ................ 10 2005 051 852

(51) Int. Cl.
*H03H 9/64*    (2006.01)
(52) U.S. Cl. ........................ 333/193; 333/195
(58) Field of Classification Search .......... 333/193–196
See application file for complete search history.

(56) References Cited

U.S. PATENT DOCUMENTS

| | | | |
|---|---|---|---|
| 4,126,837 A | 11/1978 | Koyamada et al. | |
| 4,577,168 A | 3/1986 | Hartmann | |
| 4,803,449 A | 2/1989 | Hikita et al. | |
| 4,910,481 A | 3/1990 | Sasaki et al. | |
| 5,854,579 A | 12/1998 | Penunuri | |
| 6,326,864 B1 * | 12/2001 | Takamine et al. | 333/133 |
| 6,570,470 B2 * | 5/2003 | Maehara et al. | 333/193 |
| 6,710,677 B2 | 3/2004 | Beaudin et al. | |
| 6,731,185 B2 * | 5/2004 | Taniguchi | 333/133 |
| 6,862,441 B2 | 3/2005 | Ella | |
| 6,879,224 B2 | 4/2005 | Frank | |

(Continued)

FOREIGN PATENT DOCUMENTS

DE    100 57 848    5/2002

(Continued)

OTHER PUBLICATIONS

Machine Translation for DE 10057848 dated May 23, 2002.*

(Continued)

*Primary Examiner*—Robert Pascal
*Assistant Examiner*—Alan Wong
(74) *Attorney, Agent, or Firm*—Fish & Richardson P.C.

(57) ABSTRACT

A band-stop filter is described herein. The band-stop filter includes a piezoelectric substrate and a plurality of surface wave element (SAW) impedance elements on the substrate. The band-stop filter also includes at least one series branch comprising at least one series resonator having a finger period, and a plurality of parallel branches connected electrically in parallel with the series branch, each parallel branch including at least one parallel impedance element comprising an interdigital transducer and having a finger period. The average finger period of the at least one series resonator is greater than the average finger period of the at least one parallel impedance element.

24 Claims, 9 Drawing Sheets

U.S. PATENT DOCUMENTS

| | | | |
|---|---|---|---|
| 6,924,715 B2 * | 8/2005 | Beaudin et al. | 333/133 |
| 7,446,629 B2 * | 11/2008 | Nakamura et al. | 333/133 |
| 2003/0117240 A1 * | 6/2003 | Inoue et al. | 333/195 |
| 2004/0090145 A1 | 5/2004 | Bauer et al. | |
| 2004/0130411 A1 | 7/2004 | Beaudin et al. | |
| 2004/0247153 A1 * | 12/2004 | Ruile et al. | 381/431 |
| 2004/0248614 A1 | 12/2004 | Ella | |
| 2008/0129418 A1 * | 6/2008 | Miura et al. | 333/195 |

FOREIGN PATENT DOCUMENTS

| | | |
|---|---|---|
| DE | 101 11 959 | 9/2002 |
| JP | 09-167937 | 6/1997 |
| JP | 10-065489 | 3/1998 |
| WO | WO03/069777 | 8/2003 |

OTHER PUBLICATIONS

English translation of the Written Opinion for PCT/DE2006/001798, Jan. 17, 2007.

International Search Report for PCT/DE2006/001798, Jan. 17, 2007.

Written Opinion for PCT/DE2006/001798, Jan. 17, 2007.

Caron et al., "Improved Rejection Band in SAW Ladder Filters Using High Frequency Shunt Element", IEEE International Ultrasonics, Ferroelectrics, and Frequency Control Joint 50$^{th}$ anniversary Conference 2004.

* cited by examiner

Figure 9A. State of the art

Figure 9B. State of the art

SAW FILTER COMPRISING A BROADBAND BAND-STOP FILTER

CROSS REFERENCE TO RELATED APPLICATIONS

Pursuant to 35 USC §120, this application claims the benefit of PCT/DE2006/001798 filed Oct. 12, 2006 which claims the benefit of German Patent Application No. 102005051852.4 filed Oct. 28, 2005. Each of these applications is incorporated by reference in its entirety.

BACKGROUND

Band-stop filters are needed to suppress undesired frequency bands. Such filters can be used, e.g., advantageously when one of two frequency bands lying close to each other in one wireless transmission standard is to be blanked, wherein, in addition to the desired reception band, other frequency bands are also able to pass unattenuated through the filter. In the ideal case, the passband of the filter should at least have the bandwidth of the receiving system and should generate there only minimal insertion loss. In the stop band, a filter should have high attenuation and, in the ideal case, a quick transition from the passband to the band-stop band, that is, a steep flank of the passband.

Different notch filters and band-stop filters with small stop-band widths are known, which essentially involve the interconnection of impedance elements. Such interconnections of impedance elements can be made, for example, from a ladder-type arrangement with SAW resonators, which are then arranged in series or parallel branches. For the most part, a complicated matching network is required, in order to realize, overall, a passband with reasonable bandwidth.

Another problem that can occur in SAW band-stop filters is the inability to withstand high power, which leads to the wear of electrode structures and thus to the premature failure of the corresponding filter components.

The task of the present invention is therefore to specify a band-stop filter that solves at least one of the aforementioned problems.

SUMMARY

A band-stop filter is specified, which is realized on a piezoelectric substrate and which is made from a series of SAW impedance elements arranged on this substrate. The arrangement includes at least one series branch and several parallel branches parallel to this series branch, wherein at least one series resonator is arranged in the one or more series branches and at least one parallel-impedance element comprising an interdigital transducer is arranged in each parallel branch. The decisive factor for the blocking effect of the band-stop filter is the ratio of finger periods of the interdigital transducer determining the frequency of each impedance element. The average finger period in the interdigital transducer of the one or more series resonators is here selected to be greater than the average finger periods in the interdigital transducer of the parallel impedance elements. Thus, the resonance frequency corresponding to the finger period in the interdigital transducers of the parallel impedance elements is higher than the resonance frequency of the series resonators.

With such an arrangement it is possible to achieve a stop band with a width of 2% up to greater than 5% relative to the center frequency of the stop band. For suitable selection of the finger periods, a steep flank between the stop band and the passband of the band-stop filter can also be obtained. A suitable ratio of the finger period PS of the series resonator to the finger period $P_p$ of the parallel impedance element lies between 1.03 and 1.10. With such a selection, it is achieved that the anti-resonance of the parallel impedance element forms the right flank of the band-stop filter, while the left flank of the band-stop filter is formed essentially by the anti-resonance of the series resonators.

Here it is advantageous to provide several parallel impedance elements in a corresponding number of parallel branches and also to arrange a plurality of series resonators in the series branch. Each parallel impedance element can have a finger period that is different from the other parallel impedance elements, just as each series resonator could have a different finger period, wherein for each conceivable pair, each formed from a parallel impedance element and a series resonator, preferably the aforementioned ratio of the finger periods is maintained. The greater the selected difference in the finger periods, the greater the bandwidth of the band-stop filter.

For the band-stop filter, according to the invention, it is possible to construct the parallel impedance element as a pure interdigital transducer without reflectors. Therefore, the chip surface area requirements on the surface of the piezoelectric substrate can be reduced without increasing the insertion loss in the passband. In parallel to this, costs for the substrate material can also be reduced due to the reduced component size. As another advantage of this structure, the ability of the band-stop filter to withstand high power is improved. This is exhibited namely in that, in a parallel impedance element made only from one interdigital transducer, a homogenous local power distribution is obtained over the length of the interdigital transducer without any local peaks. Therefore, this leads to a uniform load over the length of the transducer. Compared with a non-uniform power distribution with peaks, for conventional parallel impedance elements, which are typically constructed as resonators, for the proposed structure, the maximum power density occurring in the parallel impedance element is significantly reduced. This increases the service life and thus the reliability of the component and also allows the loading of the filter with a higher power relative to known band-stop filters constructed as an impedance network.

Furthermore, it is advantageous for the parallel impedance elements built as pure interdigital transducers to have a homogeneous structure, so that they have a constant metallization thickness and also constant finger widths and finger spacings viewed over the length of the transducer. A homogeneous structure of the interdigital transducer has the effect that the local resonances at points of non-homogeneity that otherwise appear, which would in turn lead to a local increase in power at the site of the non-homogeneity, are avoided.

In addition, it is also possible, in another way, to realize parallel impedance elements with minimized maximum local power density when the parallel impedance elements are constructed as SAW resonators, which have a synchronous setup. A synchronous resonator comprises a homogeneous interdigital transducer, which is bounded on both sides by a reflector, continuing at the finger width, finger period, and metallization thickness of the interdigital transducer. The spacing between the interdigital transducer and reflector also corresponds to a finger period, so that, overall, an extremely homogeneous metallization structure is realized in the synchronous resonator. With such a synchronous resonator, an extremely homogeneous power distribution is also achieved over the length of the resonator, wherein the power load occurs at the junction from the interdigital transducer to the reflector. In contrast, it can be shown that for a clearly asynchronous resonator, which has, for example, a spacing between the reflector and interdigital transducer differing from the finger period, power increases that can be traced back to additional local resonances occur at precisely this junction.

For another variant of a band-stop filter improved with respect to its ability to withstand high power, it is proposed to construct the parallel impedance elements as cascaded interdigital transducers or as resonators that have such cascaded interdigital transducers. A cascaded interdigital transducer is made up of several sub-transducers, which are interconnected in series and which are preferably arranged transversely one next to the other and closely adjacent to each other. In a cascaded transducer, n sub-transducers divide the total aperture of the cascaded interdigital transducer. This series wiring connection produces, a voltage division, so that each sub-transducer is now loaded with a smaller voltage relative to a non-cascaded transducer.

Preferably, the cascading is performed uniformly and the n sub-transducers have an identical structure. With such a structure, only the n-th part of the total voltage is applied to each sub-transducer, wherein the number n can equal at least two and can reach 5 or more. A disadvantage of this cascading is that for achieving a constant total impedance, the surface area of the transducer must be increased by a factor of $n^2$ relative to the non-cascaded interdigital transducer. This is caused by an extension of the sub-transducers or by a widening of the total aperture relative to a non-cascaded arrangement. Thus, double cascaded interdigital transducer (n=2) requires a quadruple increase in surface area for a constant impedance relative to a non-cascaded transducer. The acoustic power density is therefore reduced by a factor of 4. The degree of cascading is therefore selected only as high as is necessary for the desired ability to withstand high power, in order to minimize the surface area requirements for the band-stop filter.

Due to the finger period deviating relatively strongly from the series resonator, the parallel impedance elements act essentially as static capacitors in the passband of the band-stop filter. Because this would lead to an unfavorable position of the filter in a Smith chart, this effect is advantageously compensated by external matching elements, and in this way the filter is re-matched. For this purpose, e.g., parallel inductors are suitable, which are connected in parallel to the parallel branches, the series branches, or in parallel to the input and output.

The band-stop filter according to the invention also has the advantage that a significantly higher bandwidth, which can be significantly greater than the pole-zero distance of the parallel impedance elements or series resonators that are used, can be achieved in the passband relative to a ladder type bandpass filter. Because the resonance of the parallel impedance elements lies clearly above the passband, only small acoustic waves are excited in the passband by these elements. This has the result that with a parallel impedance element constructed as a purely interdigital transducer, insertion loss in the passband is obtained which is only slightly worse relative to a resonator equipped with reflectors. This is in contrast to series resonators, which all have reflectors for reducing insertion loss.

For matching the band-stop filter, the matching elements can be added at different locations of the ladder-type arrangement. In one construction, good matching is achieved by two parallel inductors, which are provided at the input and output of the band-stop filter in a parallel branch connected to ground.

In another construction, at least three parallel branches are provided with a parallel impedance element arranged in each branch, wherein one of the inductors is provided parallel to one of the middle parallel impedance elements in a parallel branch connected to ground.

In one structure, the number of parallel impedance elements exceeds that of series resonators. However, it is also possible to connect the band-stop filter at the input and output to at least one series resonator.

In the band-stop filter, the passband and stop band can lie directly next to each other. The steepness of the flank between the passband and stop band must increase with decreasing spacing. They can also improve when a capacitor is connected in parallel to one or more series resonators. This can be realized advantageously next to the impedance elements on the surface of the substrate as a metallization structure. The capacitor can be constructed, for example, in the form of adjacent metallized surfaces or, better, as an interdigital structure. It is advantageous to form the interdigital structure as a pure capacitor, which generates no losses in the form of emitted surface acoustic waves. For this purpose, on the one hand, the finger period can be selected to be significantly smaller than that of the interdigital transducer used in the band-stop filter. It is also possible for the interdigital structure on the surface of the substrate to have a structure rotated relative to the series resonators, so that they are arranged in a crystal direction in which surface acoustic waves are not excited or excited only weakly. For lithium tantalate as the substrate material, this is possible, e.g., with a rotation of the interdigital structure by 90° relative to the interdigital transducer of a series resonator.

A further improved property spectrum is obtained when the band-stop filter is connected in series with a bandpass filter. In this way, one obtains a combination filter element, which has both a stop band and also a passband bound on both sides by a flank. This combination element can operate in a desired passband of given bandwidth with minimum insertion loss, and in this way can attenuate a second band with high blocking effect simultaneously in a stop band directly bounding it toward higher frequencies.

Advantageously, for such a filter combination, the bandpass filter is also constructed as a ladder-type arrangement of series and parallel resonators. Additional advantages are achieved when the bandpass filter and band-stop filter are arranged on the same substrate. With respect to their finger periods and thus their center frequencies, both filters are matched to each other so that the right flank of the passband coincides with the left flank of the stop band. Thus an optimum flank and a minimum spacing between the passband and stop band are achieved. For this reason, all of the SAW impedance elements of the two filters have similar finger periods, which can be constructed with the same metallization without noticeable performance losses. In this way, the production of the bandpass filter and band-stop filter on one substrate is also possible in a common production process without additional steps.

For such a combination, it is also unnecessary to separate the bandpass filter and band-stop filter. Instead it is possible to realize the combination in a single ladder-type arrangement. Here, even the series resonators remain unchanged. These are then connected, for one, to parallel impedance elements, whose frequency positions have a matching structure as proposed for the band-stop filter. Second, parallel impedance elements are provided, whose finger periods have a matching structure for a bandpass filter. There, the anti-resonance of the parallel impedance element lies approximately at the resonance of the series resonator. The finger period of the parallel impedance element and the series resonator therefore differs in the bandpass filter only by a value that corresponds approximately to the pole-zero spacing of each resonator. This is dependent, in turn, on the substrate material and on the metallization.

In the following, the invention will be explained in more detail with reference to embodiments and the associated figures. These have a purely schematic construction that is not true to scale, so that neither relative nor absolute dimensional information can be taken from the figures.

DESCRIPTION OF THE DRAWINGS

Shown are.

DETAILED DESCRIPTION

Figure 1:
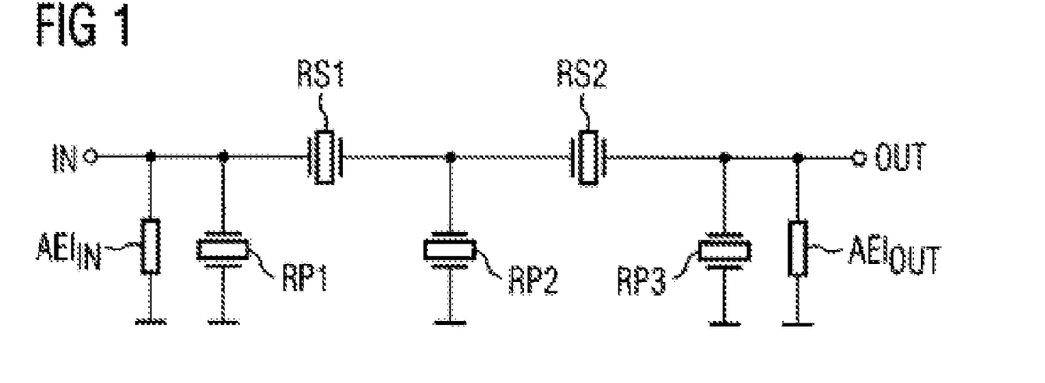
FIG. 1, a band-stop filter with matching elements in an equivalent circuit diagram, FIG. 2, the metallization structure of the filter shown in FIG. 1, FIG. 3, another metallization structure for the band-stop filter of FIG. 1, FIG. 4, an equivalent circuit diagram of another band-stop filter with inductive and capacitive matching elements, FIG. 5, the metallization structure of a filter with capacitive matching elements realized on the substrate, FIG. 6, a cascaded interdigital transducer, FIG. 7, the transmission curve of the filter shown in FIG. 1, FIG. 8a, the local power distribution on the first parallel resonator of a band-stop filter, FIG. 8b, the maximum power density on the first parallel resonator, FIG. 9a, the maximum power density versus the frequency at the first parallel resonator of a known band-stop filter, FIG. 9b, the local power distribution at the same resonator, FIG. 10a, the maximum power density at the first parallel impedance element on a band-stop filter according to FIG. 3, FIG. 10b, the local power distribution at the same parallel impedance element, FIG. 11, the connection of a band-stop filter with a band-pass filter as an equivalent circuit diagram, and FIG. 12, the transmission curve of the arrangement according to FIG. 11.

FIG. 1 shows the equivalent circuit diagram of one possible construction of a band-stop filter. This is constructed as a reactance filter with a ladder-type structure and includes a series branch, in which two series resonators RS1 and RS2 are arranged. In parallel with the series branch, there are three parallel branches, in each of which a parallel impedance element RP1 to RP3 is arranged. The parallel impedance elements include at least one interdigital transducer with a finger period $P_p$, which is smaller than the middle finger periods $P_s$ of the series resonators RS or their interdigital transducer. In addition, the filter includes two matching elements AEI, which are connected in parallel with the series branch and which are connected at the input IN and output OUT as parallel inductors to ground.

Figure 2:
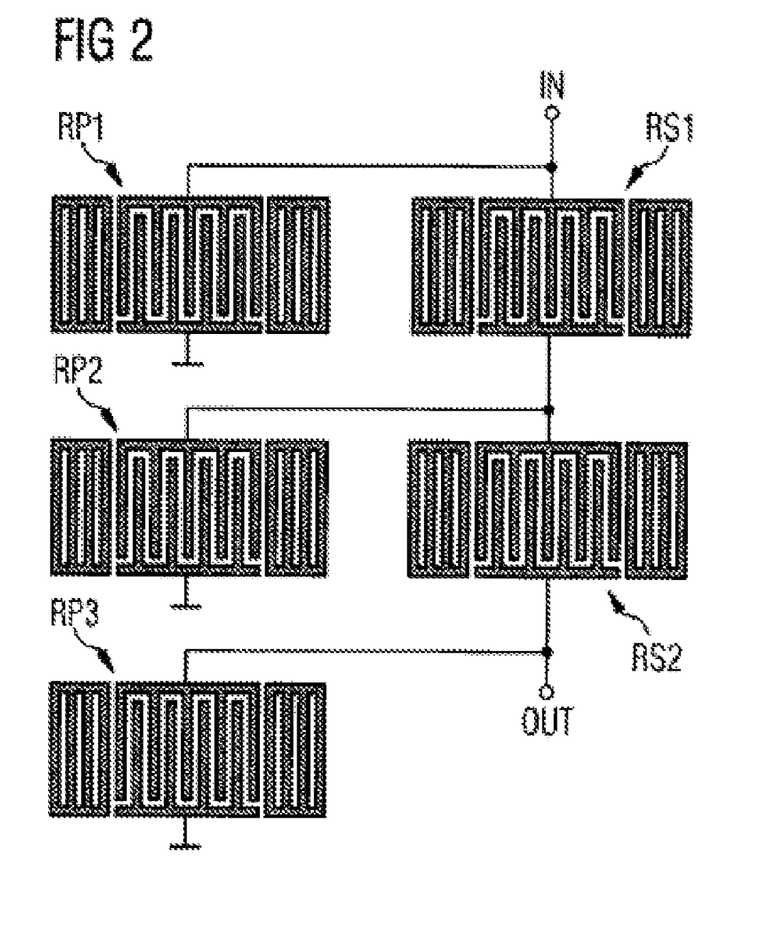

FIG. 2 shows one possible metallization structure, with which the band-stop filter shown in FIG. 1 can be realized on a piezoelectric substrate. The series resonators RS1, RS2 are constructed as single-gate resonators. The parallel impedance elements RP1, RP2, RP3 are constructed as synchronous resonators (here designated as parallel resonators), which each include, like the series resonators, an interdigital transducer, which is arranged between two reflectors. Here, the finger widths and spacings in the reflectors and in the interdigital transducer of the synchronous parallel resonator are equal and correspond to the finger period $P_p$, like the spacing of the interdigital transducer to the reflector. The inductive matching elements AEI also shown in FIG. 1 can be realized externally.

Figure 3:
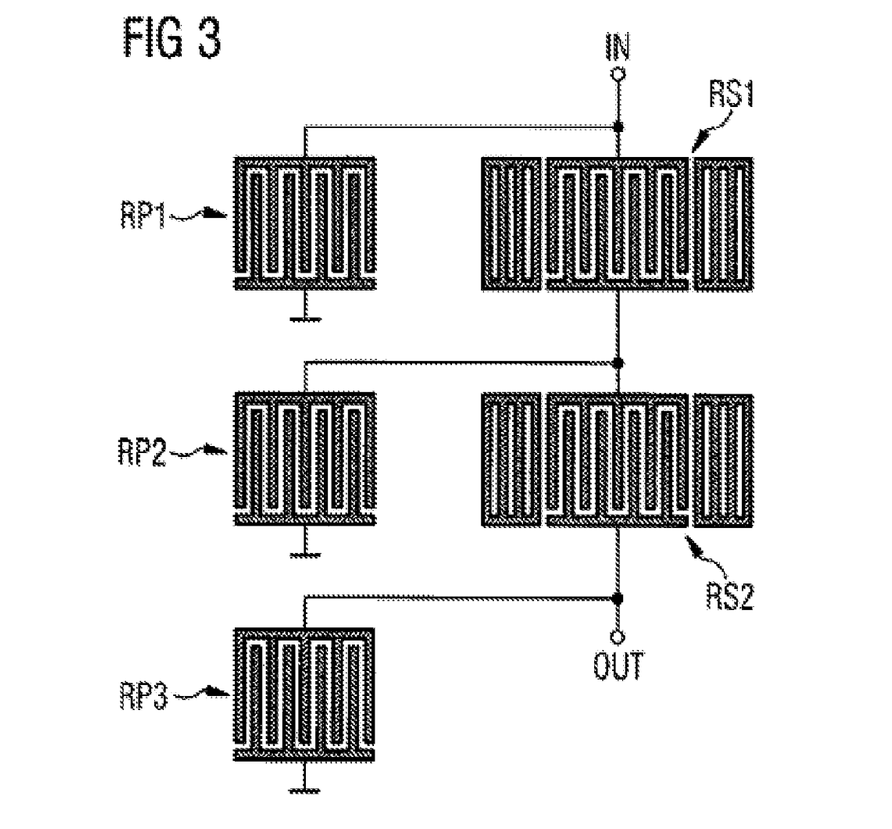

FIG. 3 shows another possible metallization structure for a band-stop filter according to the invention, in which the parallel impedance elements RP are constructed as bare interdigital structures without reflectors.

Figure 4:
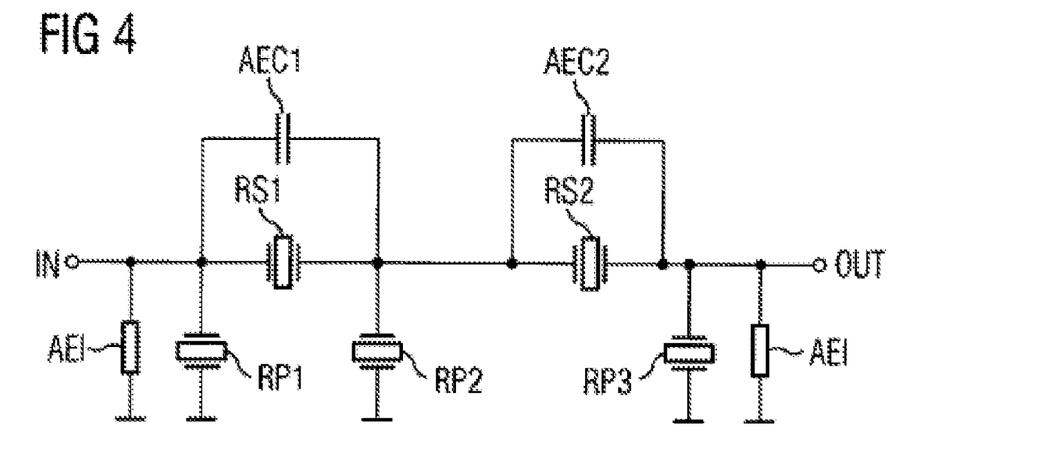

FIG. 4 shows the equivalent circuit diagram for another construction of a band-stop filter, in which, starting with the band-stop filter shown in FIG. 1, two other matching elements AEC are also provided, which each include capacitors AEC1, AEC2 connected in parallel with the series resonators. With these additional matching elements AEC, the right flank of the passband can have a steeper slope.

Figure 5:
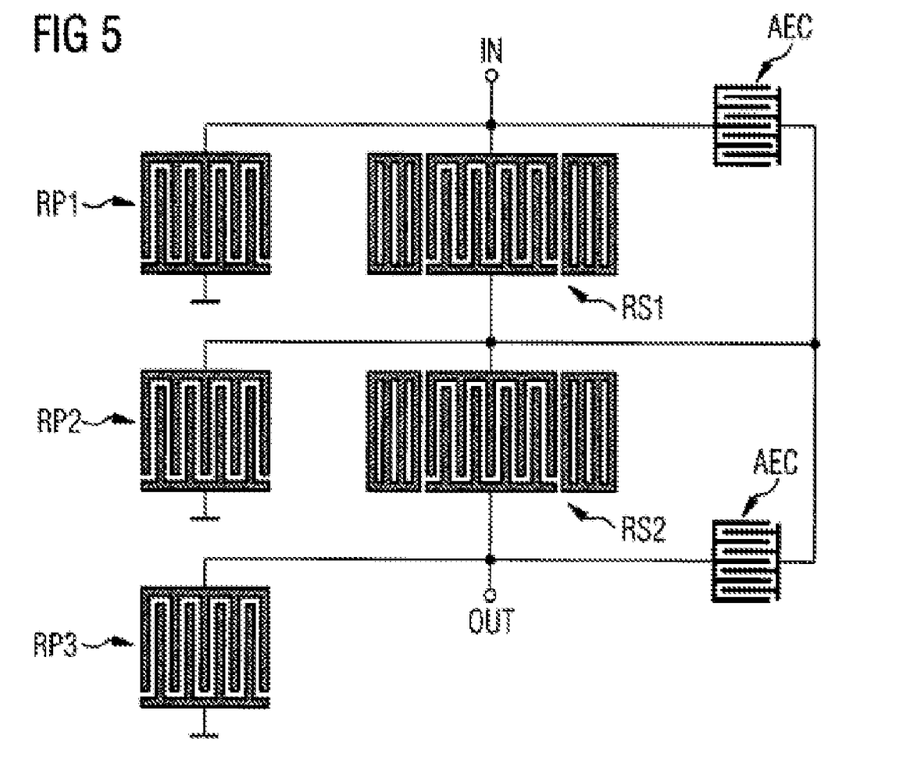

FIG. 5 shows a metallization for the band-stop filter shown in FIG. 4, in which the capacitive matching elements AEC are constructed as a metallization structure on the piezoelectric substrate and are shaped here in the form of an interdigital transducer. For preventing interaction with a series resonator or a parallel impedance element, the finger period in the capacitive matching elements AEC is selected to be smaller than in the series resonator and therefore also smaller than in the parallel impedance element. In addition, the interdigital transducer is rotated by 90° relative to the series resonator.

Figure 6:
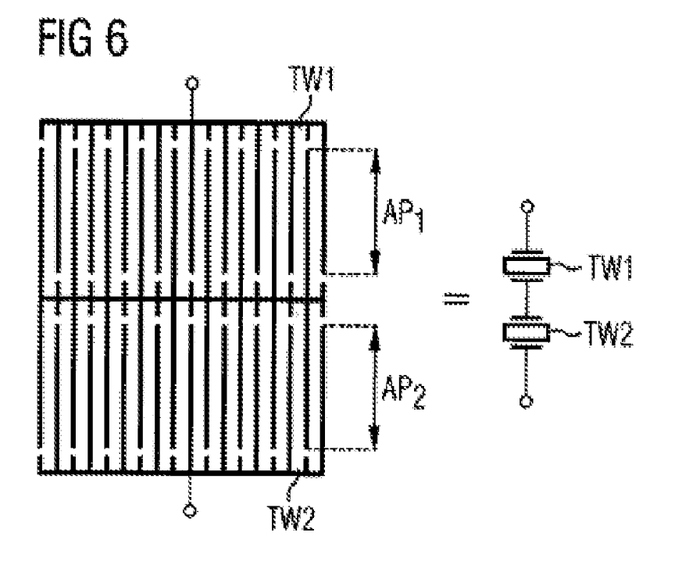

FIG. 6 shows a cascaded interdigital transducer, which can be used both as a parallel impedance element and also in a series resonator together with reflectors. The cascaded interdigital transducer includes two sub-transducers TW1 and TW2 connected in series and can have a common middle current rail. Preferably, the cascading is symmetric, so that the sub-apertures AP1, AP2 have the same size. The two sub-tracks preferably operate with opposite acoustic phase. The cascaded interdigital transducer, however, can also be converted into an interdigital transducer down with sub-tracks that can operate with the same phase, e.g., by turning one of the sub-tracks.

Figure 7:
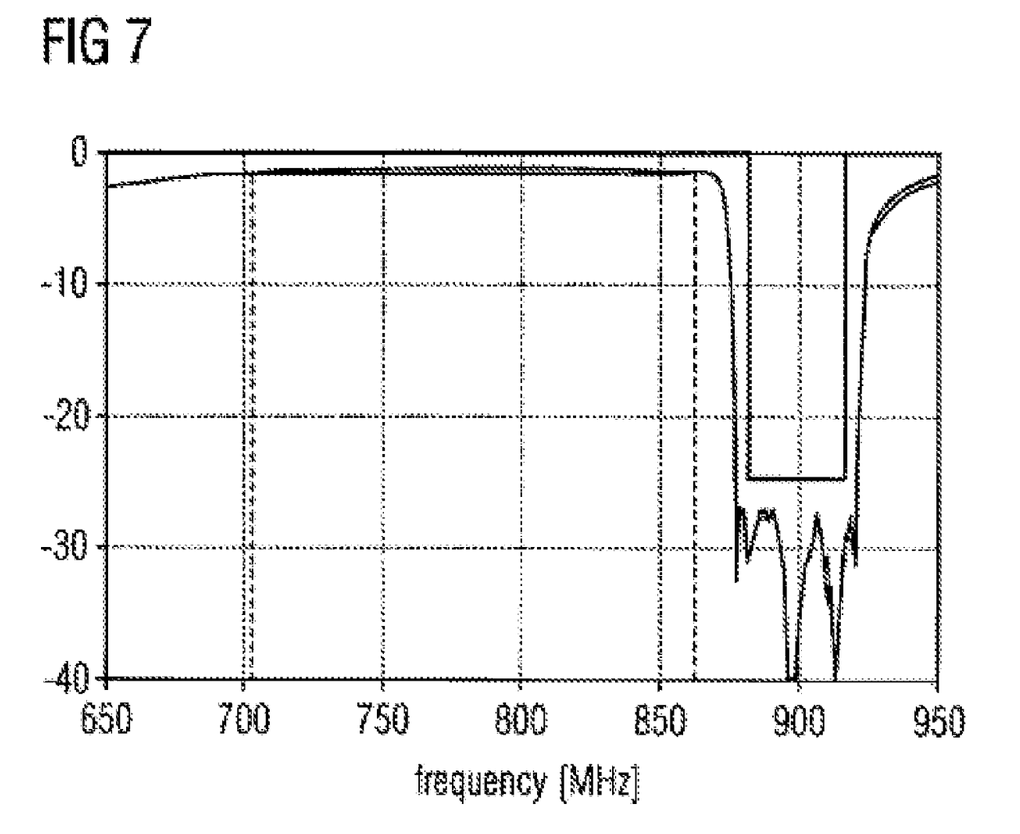

FIG. 7 shows the transmission curves placed one above the other for two band-stop filters, which are constructed according to the equivalent circuit diagram of FIG. 1 and with metallization layers as shown in FIG. 2 or FIG. 3. One sees that both filters have nearly identical transmission curves and differ from each other only in the stop band. This shows that the structure with parallel impedance elements are practically identical with and without reflectors, so that the structure without reflectors is almost always preferred due to the achievable gain in space on the surface of the substrate.

FIG. 7 further shows that the relative bandwidth of the passband equals more than 5% and here even 20% relative to its center frequency. The transition from the very wide passband with small insertion loss of a maximum +/−2 dB to the stop band runs with a steep flank, which falls within less than 20 MHz. (The center frequency of the band-stop filter here lies at ca. 900 MHz.) This shows that the band-stop filter can be used with excellent results for blocking a stop band in close proximity to a useful band.

Figure 8A:
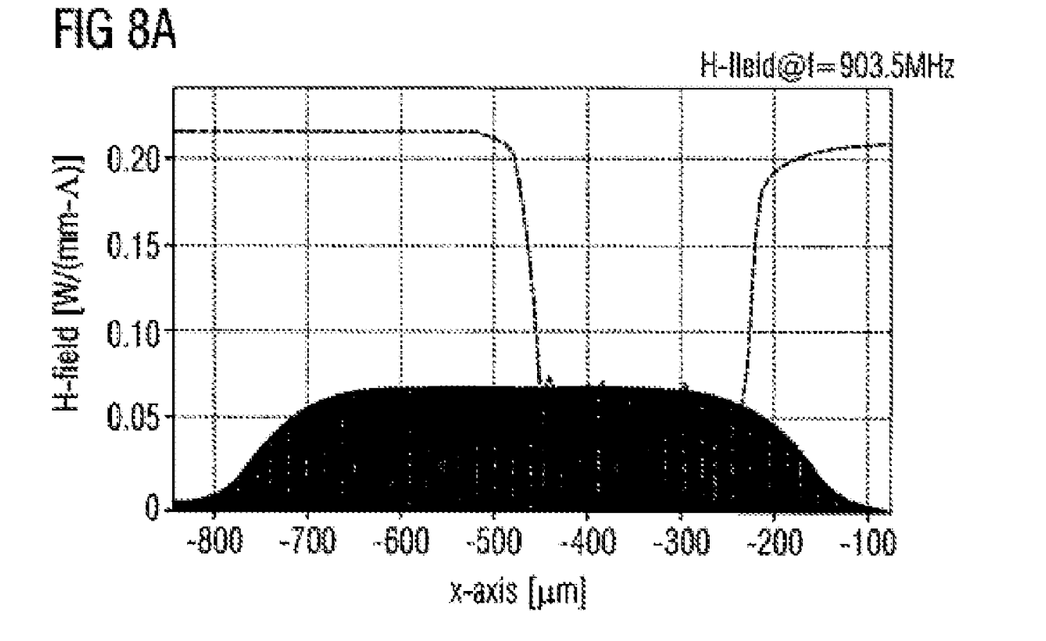
Figure 8B:
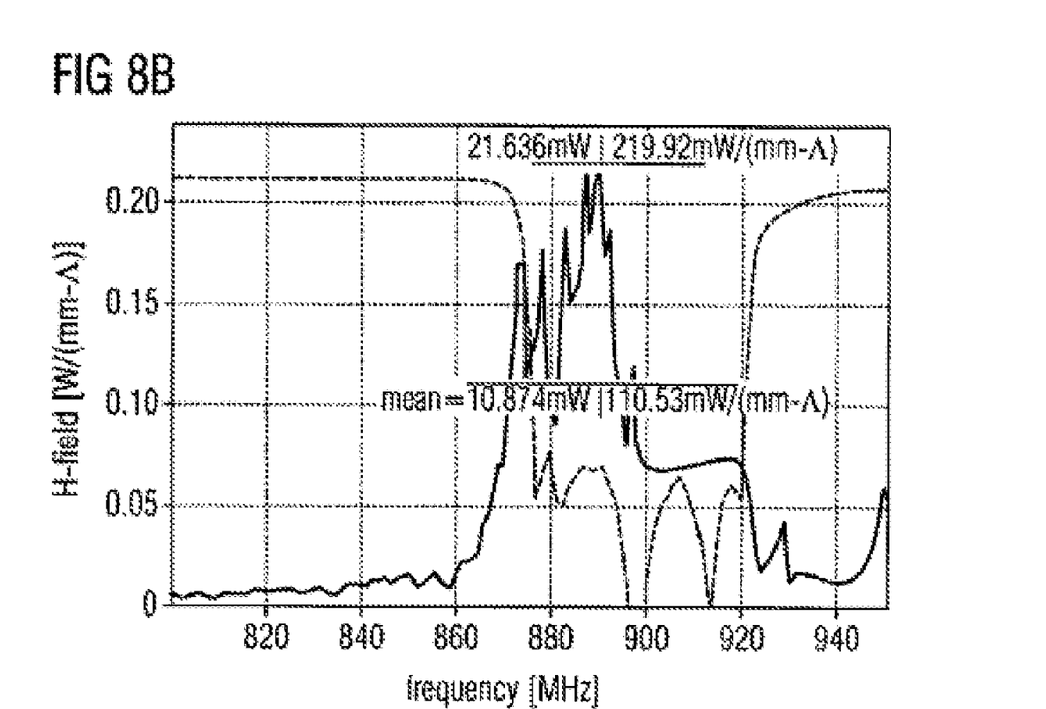

The representations in FIGS. 8a and 8b show the ability to withstand high power, which can be achieved with a band-stop filter constructed according to FIGS. 1 and 2. FIG. 8a shows the power distribution on the first parallel impedance element at a fixed frequency of, here, 903.5 MHz. The power distribution is determined over the length of parallel impedance element constructed as a synchronous resonator and is shown for each individual transducer finger in the form of a vertical line on the X-axis, where the X-axis represents the length dimension of the parallel resonator. It shows that the power distribution is extremely homogeneous and decreases at the end of the interdigital transducer toward the reflector. This homogeneous power distribution guarantees that all of the fingers are loaded uniformly with power, so that load peaks are not produced at any point that could result in damage to the metallization structure.

While the power distribution according to FIG. 8a is set at a fixed frequency, FIG. 8b shows how the maximum power density determined on the first parallel resonator varies versus frequency. It shows that the parallel resonators are loaded only in the stop band according to their function, where the maximum power density in the stop band also acts on the parallel resonators (here on the first parallel resonator) with a relatively uniform distribution versus frequency.

Figure 9A:
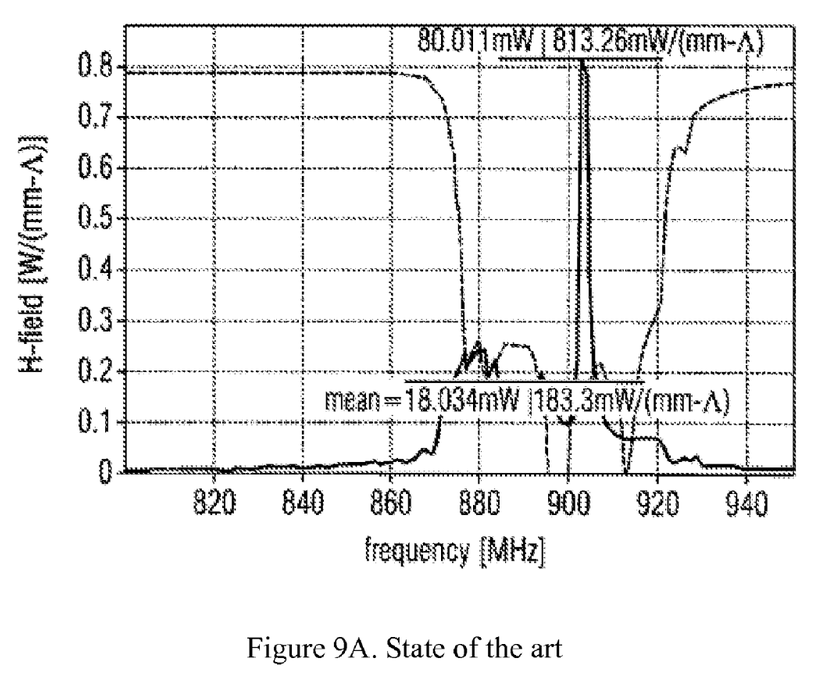

In comparison to this, in FIG. 9a, the power distribution for a similar band-stop filter is shown in which the parallel impedance elements constructed in FIG. 8a as synchronous resonators are here replaced with asynchronous resonators. For this purpose, homogeneous interdigital transducers and homogeneous reflectors are used, wherein, however, the finger period in the reflector is 1% smaller than in the transducer and wherein the transducer reflector spacing (measured at the finger edges) is reduced by 12% compared with the finger period of the interdigital transducer.

From the power distribution according to FIG. 9a, it is shown that an asynchronous parallel resonator has a narrowband increase in power in the stop band at ca. 903.5 MHz, whose power density lies by a factor of ca. 4 above the average value. This means that a band-stop filter loaded with this frequency has a greatly reduced service life. Simultaneously, it shows the advantage with respect to power compatibility of a band-stop filter constructed according to the invention with synchronous resonators as parallel impedance elements.

Figure 9B:
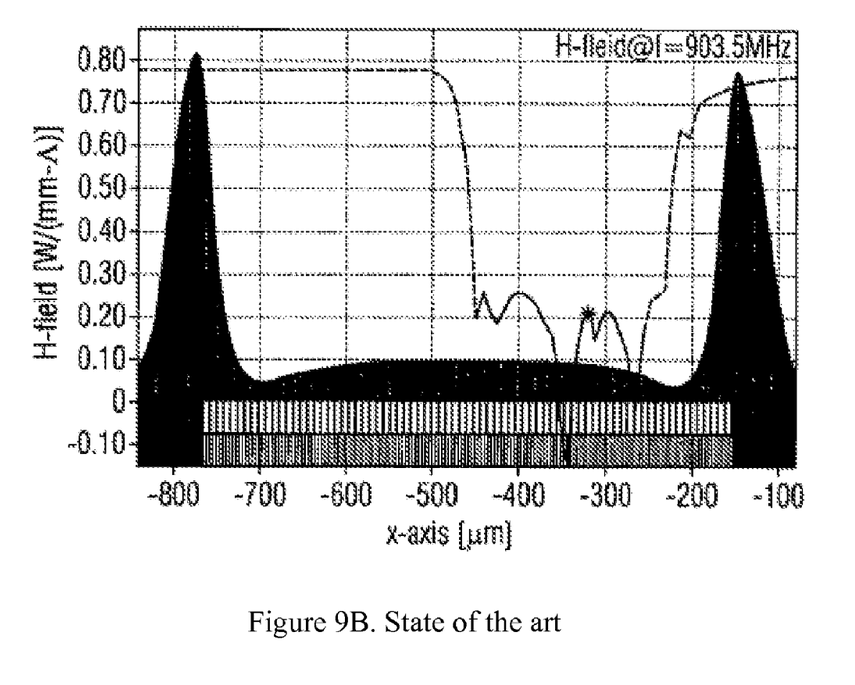

FIG. 9b shows, once again for illustrative purposes, the power distribution determined over the length of the first parallel resonator for an asynchronous parallel resonator. One can see that here the power is no longer distributed homogeneously over the length of the parallel resonator, but instead increased power occurs in the transition between the interdigital transducer and reflector, which can be traced back to resonances formed there. Thus, it is also clear that such a resonator is clearly reduced in its power compatibility relative to a synchronous resonator.

Figure 10A:
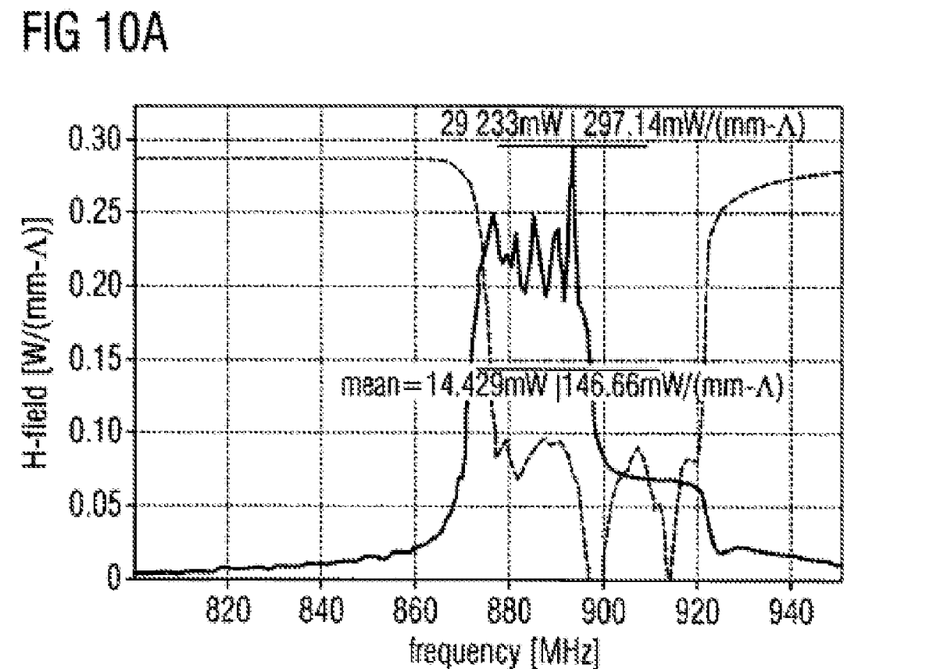

FIG. 10a shows the power density in the first parallel impedance element RP1 of a band-stop filter constructed according to FIG. 3 with parallel impedance elements constructed as homogeneous interdigital transducers. Here, it is shown almost even more strikingly than in the structure with synchronous resonators that the maximum power density determined over the frequency on the first parallel impedance element is extremely uniform over frequency. This means that in the stop band excess power increases do not occur, which could lead to loading of the band-stop filter.

Figure 10B:
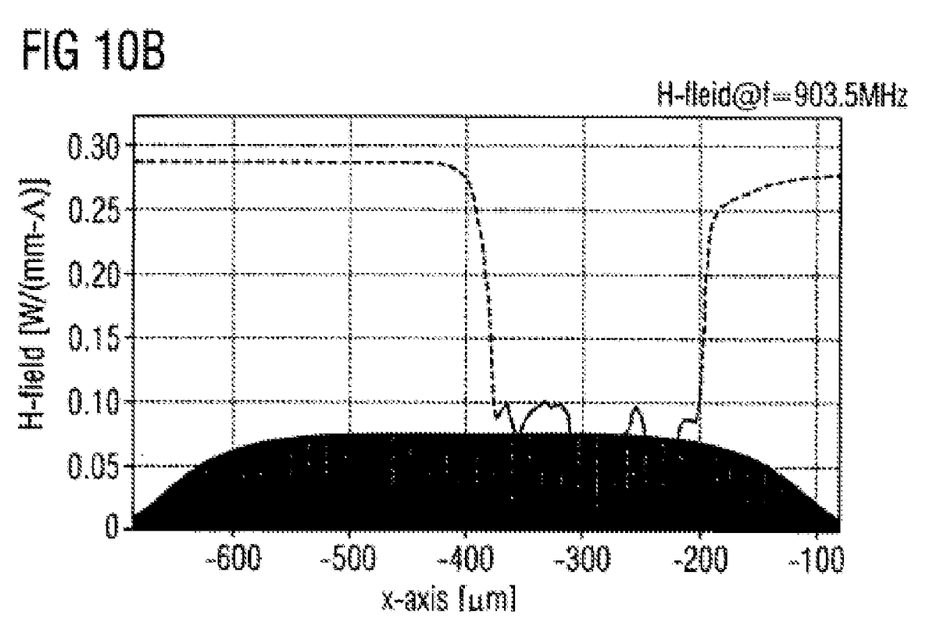

FIG. 10b shows the simulated power distribution for the example frequency of 903.5 MHz over the length of the first of the parallel impedance elements constructed as homogeneous interdigital transducers. Here it is also shown that the power is distributed uniformly across the interdigital transducer and no power increase takes place.

In the following, a band-stop filter according to the invention will be described in more detail using an example. The filter has three parallel impedance elements, which are each constructed as homogeneous interdigital transducers without reflectors, as specified in FIG. 1. In the serial branch there are two series resonators, which are constructed as synchronous resonators. The filter is constructed on a lithium tantalate substrate with a metallization structure, e.g., made from AlCuAl. The total metal layer thickness equals ca. 330 nm. The metallization ratio is set to 0.65. Each reflector of the series resonators contains ca. 34 reflector fingers. At the input and output of the filter, an inductive matching element AEE with an inductance of ca. 6 nH is connected in parallel with the series branch.

The following table applies for each impedance element (series resonator or parallel impedance element), the finger number, the aperture, the period, the cascading, and the ratio between the finger periods of the reflector and transducer in the series resonators:

| ①<br>Element | ②<br>Fingerzahl | ③<br>Apertur | ④<br>Finger-<br>periode | ⑤<br>Kaskadierung | ⑥<br>$P_{ref}/P_{idt}$ |
|---|---|---|---|---|---|
| RP1 | 280 | 98 | 2,1879 | 3 | |
| RS1 | 300 | 132 | 2,3254 | 2 | 1,0147 |
| RP2 | 250 | 87 | 2,1301 | 4 | |
| RS2 | 240 | 101 | 2,3077 | 1 | 1,0278 |
| RP3 | 180 | 93 | 2,1443 | 2 | |

[Note: Commas designate decimal points.]
Key:
1 Element
2 Finger number
3 Aperture
4 Finger period
5 Cascading
6 $P_{res}/P_{idt}$ With these values, the metallization structure shown schematically in FIG. 3 is realized, from which the transmission curve shown in FIG. 7 is obtained.

With a structure formed with additional capacitive matching elements AEC as in FIG. 5, an even more improved flank between the stop band and the passband can be achieved.

Figure 11:
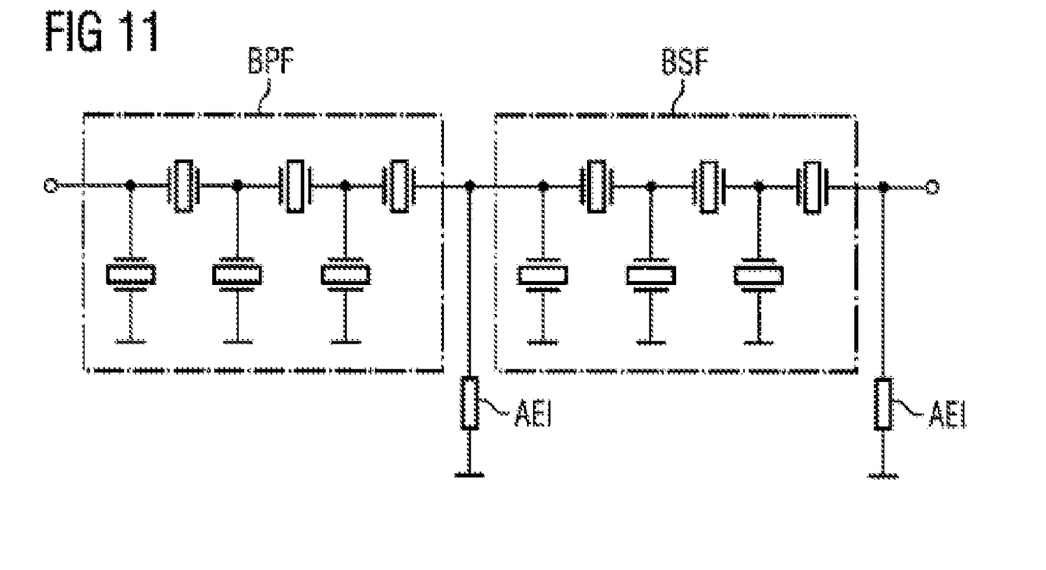

FIG. 11 shows as an equivalent circuit diagram the connection of a conventional bandpass filter BPF with a band-stop filter BSF according to the invention, with which new advantageous properties are achieved. The bandpass filter is constructed as a ladder-type structure with three series resonators and three parallel resonators.

The band-stop filter can be constructed, for example, as shown in FIG. 1, 2, 3, or 5. Capacitive matching elements can be connected on the substrate surface, and inductive matching elements as external elements can be connected parallel to the series branch to ground. Both filters BPF and BSF can be realized on a common piezoelectric substrate, for example, on a common lithium tantalate chip.

Figure 12:
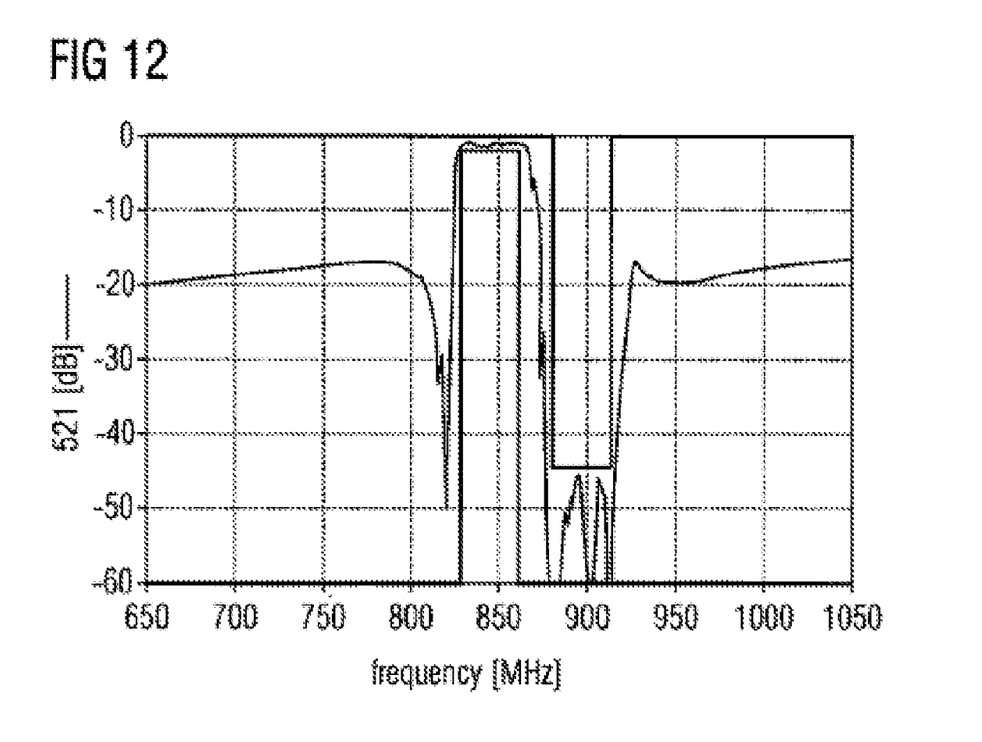
Figure 13:
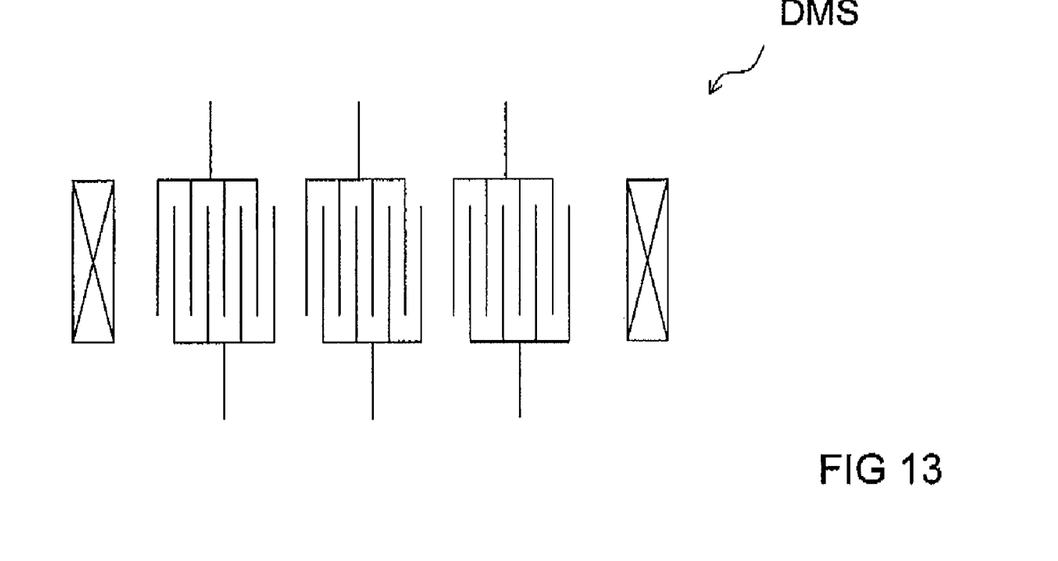
FIG. 13 shows a DMS structure comprising three interdigital transducers arranged between reflectors.
Figure 14:
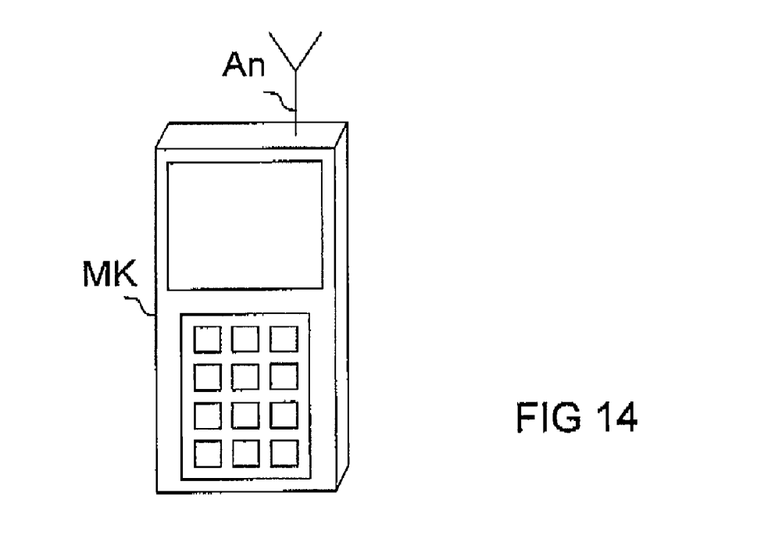
FIG. 14 shows a wireless communication end device comprising an antenna.

From these connections, the transmission curve shown in FIG. 12 is obtained, which, surprisingly combines the properties of both filters advantageously. In addition to a sharply limited passband, which now also has a steep left flank, a wider band-stop band is formed, which has an even higher selection of ca. 45 dB relative to the pure band-stop filter. The passband and stop band each have a bandwidth of ca. 5%.

In one modification of the structure shown in FIG. 11, the parallel impedance elements of the bandpass filter and band-stop filter can be realized within a common ladder-type structure and arbitrarily arranged one inside the other. All of the parallel impedance elements of the two filter types can be formed without reflectors as homogeneous interdigital transducers, which are preferably cascaded. The series impedance elements are constructed as resonators with reflectors, which also can have cascaded interdigital transducers. The series resonators are here formed asynchronously with different finger periods in the interdigital transducer and in the reflector. The distance between the reflectors and interdigital transducer in the series resonators can be regular and can correspond to a finger period, where the distances are each defined from finger center to finger center. In this way, a reduced power density and thus a higher power compatibility of the total filter is also obtained in the series resonator. However, it is also possible to realize different distances between the interdigital transducers and reflectors in the series resonators.

The bandpass filter (BPF), however, can also be realized as a DMS filter (Dual or Double Mode SAW). It can be realized as a single ended/balanced DMS filter and thus can have an integrated BALUN function (Balanced/Unbalanced). The DMS filter can be realized on the same substrate as the ladder-type SAW filter, but preferably on a separate substrate.

The invention was explained only with reference to a few embodiments but to which it is not limited. In particular, the number, arrangement, and cascading of the series and parallel impedance elements can be varied arbitrarily. The same variation is possible with respect to number of fingers, apertures, and the variance of the finger periods over all of the impedance elements of one branch (parallel branch or series branch). According to the invention, the band-stop filters are suitable, for example, for use in future end devices for mobile communications, in order to decouple an antenna designed for the digital television standard DVB-H from the TX band of the close GSM 800 standard or to protect the television signal from interference signals from this TX band. It is further possible to use band-stop filters according to the invention in receivers for the digital TV standard DVB-T in order to filter out the TX band from GSM mobile radio devices.

The invention claimed is:

1. A band-stop filter comprising:
a piezoelectric substrate,
a plurality of surface wave element (SAW) impedance elements on the substrate,
at least one series branch comprising at least one series resonator having a finger period, and
a plurality of parallel branches connected electrically in parallel with the at least one series branch, each parallel branch comprising at least one parallel impedance element comprising an interdigital transducer and having a finger period,
wherein the average finger period of one of the at least one series resonator is greater than the average finger period of all of the at least one parallel impedance element,
further comprising capacitive matching elements connected in parallel with the at least one series branch.

2. The band-stop filter of claim 1, wherein a ratio of the finger period of one of the at least one series resonator of one of the at least one series branch to the finger period of one of the at least one parallel impedance element of one of the plurality of parallel branches is between about 1.03 and 1.10.

3. The band-stop filter of claim 1, wherein the band-stop filter has a relative bandwidth of about 2% to 5.5%.

4. The band-stop filter of claim 1, wherein one of the at least one parallel impedance element of one of the plurality of parallel branches comprises an interdigital transducer without reflectors.

5. The band-stop filter of claim 1, wherein one of the at least one parallel impedance element of one of the plurality of parallel branches comprises varying finger widths and finger spacings, a maximum variation in size from one electrode finger to an adjacent electrode finger being about 0.05%.

6. The band-stop filter of claim 1, wherein one of the at least one parallel impedance element of one of the plurality of parallel branches is homogeneous and has a constant metallization height, constant finger widths, and constant finger spacings.

7. The band-stop filter of claim 1, wherein one of the at least one parallel impedance element of one of the plurality of parallel branches comprises synchronous resonators having a constant finger width, finger period, and metallization height over a resonator length.

8. The band-stop filter of claim 7, wherein a spacing of the fingers of a reflector of one of the at least one parallel impedance elements of the corresponds to the finger period of the interdigital transducer of the one of the at least one parallel impedance elements.

9. The band-stop filter of claim 1, wherein the at least one parallel impedance element of at least one of the plurality of parallel branches of the band-stop filter comprises a plurality of parallel impedance elements and the at least one series resonator of the at least one series branch of the band-stop filter comprises a plurality of series resonators, and the number of parallel impedance elements included in the plurality parallel impedance is greater than the number of series resonators included in the plurality of series resonators.

10. The band-stop filter of claim 1, further comprising inductive matching elements connected in parallel with the plurality of parallel branches.

11. The band-stop filter of claim 10, further comprising a first inductor on the input and a second inductor on the output of the band-stop filter in a parallel branch electrically connected to ground.

12. The band-stop filter of claim 10, further comprising at least three parallel impedance elements each in a parallel branch of the plurality of parallel branches.

13. The band-stop filter of claim 12, further comprising an inductor in a parallel branch parallel to one of the parallel impedance elements and electrically connected to ground.

14. The band-stop filter of claim 10, wherein the capacitive matching elements comprise capacitors.

15. The band-stop filter of claim 14, wherein each of the capacitors comprises an interdigital structure on the piezoelectric substrate having a finger period smaller than the finger period of the at least one series resonator, wherein the interdigital structure is rotated relative to the at least one series resonator, such that the capacitor cannot generate surface acoustic waves on the substrate.

16. A device comprising the band-stop filter of claim 1, electrically connected in series to a bandpass filter comprising at least one parallel resonator in at least one parallel branch, wherein the finger period of the at least one parallel resonator is greater than the finger period of the at least one series resonator.

17. A device comprising the band-stop filter of claim 1, further comprising a bandpass filter connected with the band-stop filter in series.

18. The device of claim 17, wherein the bandpass filter comprises a ladder-type filter.

19. The device of claim 17, wherein the bandpass filter comprises a dual mode SAW (DMS) filter.

20. The device of claim 17, wherein the bandpass filter comprises a single ended/balanced DMS filter.

21. The band-stop filter of claim 1, wherein one of the at least one parallel impedance element of one of the plurality of parallel branches comprises cascaded interdigital transducers.

22. The band-stop filter of claim 21, wherein the cascaded interdigital transducers comprise sub-transducers connected in series, the sub-transducers being in a transverse direction one next to the other having substantially identical aperture and a finger connection sequence, the finger connection sequence generating a phase offset of two acoustic waves of about half-wavelength in two transverse adjacent sub-transducers of the cascade.

23. An antenna, comprising:
 a band-stop filter, comprising:
  a piezoelectric substrate,
  a plurality of surface wave element (SAW) impedance elements on the substrate,
  at least one series branch comprising at least one series resonator having a finger period, and
  a plurality of parallel branches connected electrically in parallel with the at least one series branch, each parallel branch comprising at least one parallel impedance element comprising an interdigital transducer and having a finger period,
  wherein the average finger period of one of the at least one series resonator is greater than the average finger period of all of the at least one parallel impedance element,
  wherein the antenna is configured for an audio and/or video receiver for blocking a mobile radio frequency band adjacent to an audio and/or video transmission band of the audio and/or video receiver,
  further comprising capacitive matching elements connected in parallel with the at least one series branch.

24. A wireless communication end device for mobile radio, comprising:
 a band-stop filter, comprising:
  a piezoelectric substrate,
  a plurality of surface wave element (SAW) impedance elements on the substrate,
  at least one series branch comprising at least one series resonator having a finger period, and
  a plurality of parallel branches connected electrically in parallel with the at least one series branch, each parallel branch comprising at least one parallel impedance element comprising an interdigital transducer and having a finger period,
  wherein the average finger period of one of the at least one series resonator is greater than the average finger period of all of the at least one parallel impedance element,
  wherein the device is configured for receiving in a frequency band transmitting video and/or audio data, for blocking a mobile radio frequency band adjacent to the frequency band transmitting video and/or audio data,
  further comprising capacitive matching elements connected in parallel with the at least one series branch.

* * * * *

UNITED STATES PATENT AND TRADEMARK OFFICE
CERTIFICATE OF CORRECTION

PATENT NO. : 7,876,179 B2
APPLICATION NO. : 12/091077
DATED : January 25, 2011
INVENTOR(S) : Thomas Bauer and Matthias Jungkunz It is certified that error appears in the above-identified patent and that said Letters Patent is hereby corrected as shown below:

Claim 9, Column 10, Line 20 – delete "plurality" and insert -- plurality of --, thereof.

Claim 9, Column 10, Line 21 – delete "impedance" and insert -- impedance elements --, thereof.

Signed and Sealed this
Third Day of May, 2011

David J. Kappos
*Director of the United States Patent and Trademark Office*